Aug. 22, 1967 J. E. CELTO 3,337,426

PROCESS FOR FABRICATING ELECTRICAL CIRCUITS

Filed June 4, 1964 2 Sheets-Sheet 1

JOHN E. CELTO
INVENTOR.

BY [signature]
AGENT

[signature]
ATTORNEY

PROCESS FOR FABRICATING ELECTRICAL CIRCUITS

Filed June 4, 1964 2 Sheets-Sheet 2

JOHN E. CELTO
INVENTOR.

BY [signature]
AGENT

[signature]
ATTORNEY 3,337,426
Patented Aug. 22, 1967

3,337,426

PROCESS FOR FABRICATING ELECTRICAL CIRCUITS

John E. Celto, San Diego, Calif., assignor to General Dynamics Corporation, San Diego, Calif., a corporation of Delaware Filed June 4, 1964, Ser. No. 372,468
8 Claims. (Cl. 204—15)

This invention relates to electrical circuits, and more particularly to a method for preparing thin film passive circuit elements and interconnections.

In accordance with the present invention, a continuous film of a suitable conducting material, such as aluminum, is deposited upon an insulating substrate. The surface of the conducting film is electrochemically converted into a non-conducting oxide to a predetermined depth. A resist pattern defining capacitor base electrodes is applied to the oxidized surface, and the exposed areas are further oxidized to provide a non-conducting oxide extending down to the substrate. The resist pattern is removed and a continuous film of a resistive material is applied on top of the metal oxide. Atop the resistive material, a continuous highly conductive film is applied.

A second resist pattern defining resistors and conductors is applied to the surface of the highly conductive film. The unprotected conductive and resistive films are then etched away. After removal of the second resist pattern, a third resist pattern is applied, defining the resistors, and the conductive film over the resistive film is selectively etched away. Upon removal of the third resist pattern, active devices such as transistors and diodes may be added, as well as circuit input and output leads.

It is, therefore, an object of this invention to facilitate the assembly of compact thin film electrical circuits.

Another object of this invention is to provide a new and improved method of producing thin film microcircuits incorporating passive components.

Another object of this nivention is to provide a method of producing thin film circuits which are extremely compact.

Another object of this invention is to provide a method of producing thin film circuits which is simple, inexpensive, and adapted to large scale production employing relatively unskilled personnel.

Further objects and advantages of this invention will become apparent from consideration of the following description and appended drawings, wherein.

Figure 1:
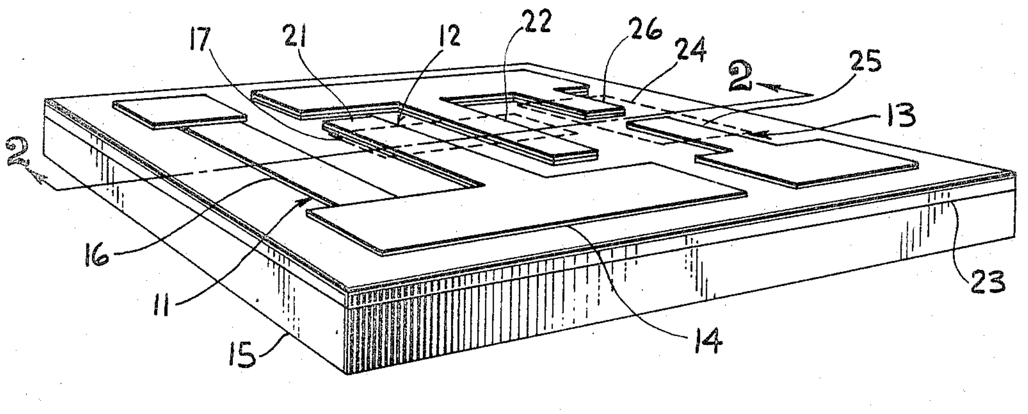
FIGURE 1 is a perspective view of a passive element thin film circuit produced in accordance with the present invention.
Figure 2:
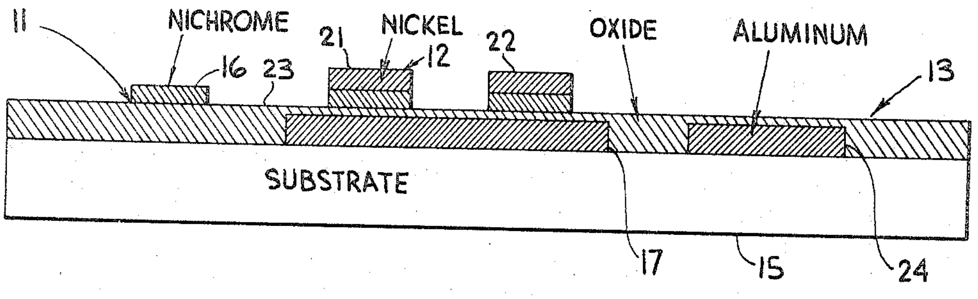
FIGURE 2 is a cross-section taken along line 2—2 of FIGURE 1.

Referring now to FIGURES 1 and 2 of the drawing, a thin film circuit comprising a resistor 11, two capacitors 12 and 13, and interconnections, exemplarily 14, on an insulating substrate 15, are illustrated.

Resistor 11 is constituted on an insulating oxide layer of a strip 16 of resistive material such as Nichrome, having a width, length, and thickness to give the required resistance. Each end is connected to a conductor such as 14.

Capacitor 12 is composed of a conductive base electrode 17 and upper electrodes 21 and 22, insulated from base electrode 17 and from one another by a non-conducting oxide layer 23. Capacitor 13 is similarly composed, conductive base electrode 24 is overlaid by upper electrodes 25 and 26, insulated from one another by non-conducting oxide layer 23.

Figure 3:
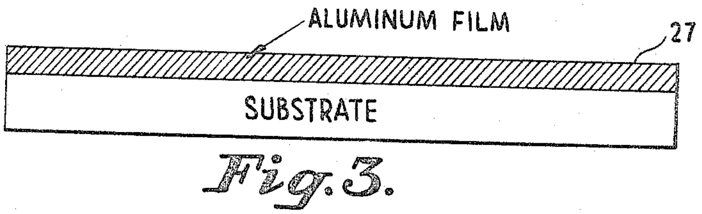
FIGURES 3–8 are cross-sections taken along line 2—2 of FIGURE 1 illustrating the stages in the construction of the circuit of FIGURES 1 and 2.
Figure 4:
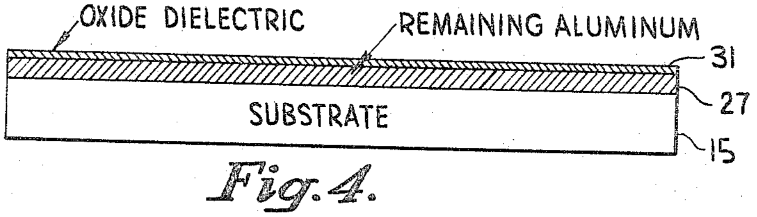
Figure 5:
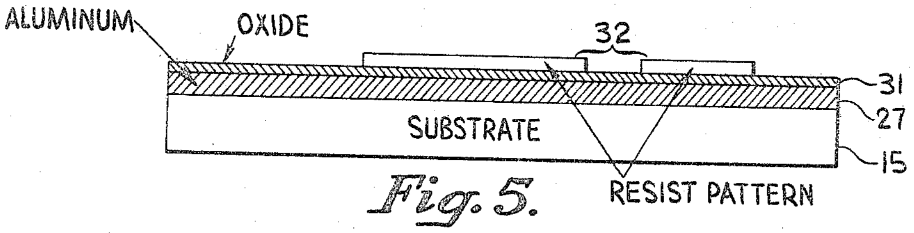

Referring now to FIGURE 3, the thin film circuit panel illustrated by FIGURES 1 and 2 is fabricated on a substrate 15 of a chemically inert insulating material. Conveniently, thin glass is employed. A continuous thin film 27 of conducting material, exemplarily, aluminum, is vacuum deposited as by evaporation or cathode sputtering on glass substrate 15 in a manner well-known to the art. The surface of the aluminum film is converted to a non-conducting layer 31 of an aluminum oxide, as by anodizing. In order to closely control the thickness of oxide layer 31, electrochemical anodizing employing a solution of 5% aqueous tartaric acid and ammonium hydroxide with a pH of 5.5 diluted with propylene glycol to give a volume resistivity of 500 ohms is employed.

Figure 6:
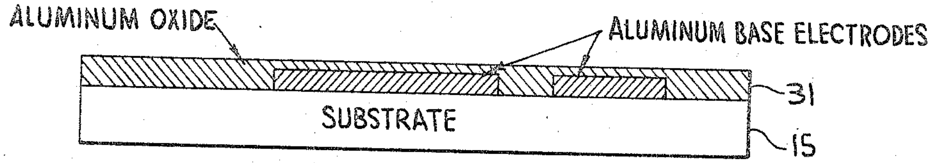
Figure 7:
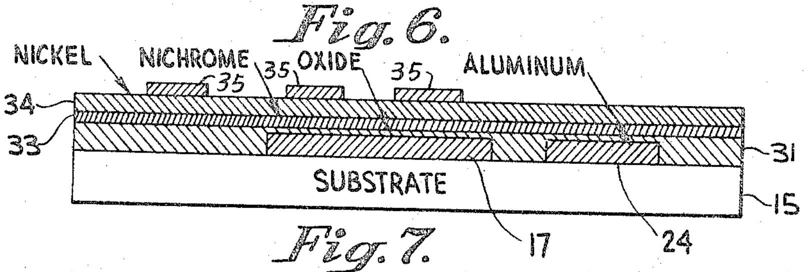
Figure 8:
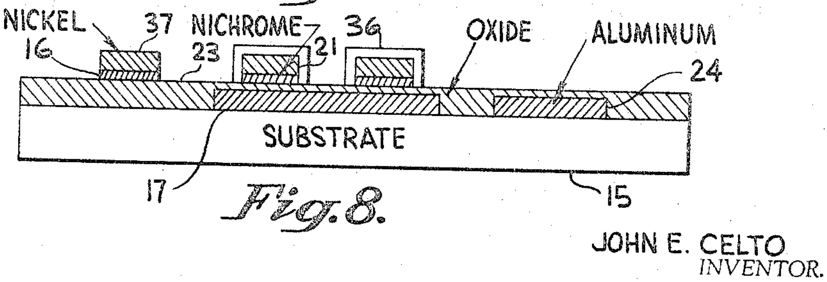

To form capacitor base electrodes 17 and 24, a first resist pattern 32 is applied to oxide surface 31 by well-known photo techniques to protect the areas of the capacitor base electrodes. Silk screen or stencil methods well known to the art may also be employed. The areas of oxide layer 31, and the portion of aluminum film layer 27 not overlaid by resist pattern 32 are exposed to a port forming electrolytic anodizing solution comprising a 1000 ohm cm. aqueous solution of oxalic acid, converting all of the aluminum film not covered by resist 32 into aluminum oxide, down to substrate 15, as depicted in FIGURE 6. Resist 32 is then removed at the completion of this step, aluminum base electrodes 17 and 24 on substrate 15 are covered and surrounded by insulating aluminum oxide 31.

A layer 33 of a suitable resistive material, such as Nichrome, is vacuum deposited atop aluminum oxide layer 31. The Nichrome layer 33 is deposited to a thickness giving the required sheet resistivity. Atop Nichrome layer 33, a continuous layer 34 of a suitable conductive material, such as nickel, is vacuum deposited to ultimately furnish the circuit conductors.

A second resist pattern 35 defining resistors such as resistor 11 and conductors including the upper electrodes such as 22 of the capacitors, and interconnections such as 14, is applied to the surface of nickel layer 34. Resist pattern 35 may be applied employing photo, silk screen or spray techniques, well known to those skilled in the art. A suitable etching solution which etches both the nickel and Nichrome, exemplarily a solution of 200 gm. of $FeCl_3$ per liter of propylene glycol at a temperature of 75 degrees C., is employed to completely remove the nickel and Nichrome exposed by second resist pattern 35. The second resist pattern is removed.

A third resist pattern 36 is applied, covering and protecting from further etching those areas of the resistor and conductor pattern that are to be conductors. The nickel layer 37 is removed from the Nichrome layer 16 at the resistor 11 by etching in a bath of 25% $HNO_3$, which etches away the nickel 36 but does not effect the Nichrome 16 or aluminum oxide 23.

The third resist pattern 36 is removed, the panel is released, and leads, jumpers, and active devices such as diodes and capacitors, are suitably attached as by bonding or soldering.

It is to be understood in connection with this invention that the method described herein is exemplary only, and that various modifications may be made without departing from the scope of the invention as defined in the appended claims.

I claim:

1. A method of electrical circuit fabrication which comprises the steps of depositing a first conductive layer on an insulating substrate, converting the surface of said first conductive layer to a nonconducting dielectric, applying a first resist pattern defining capacitor base electrodes to said nonconducting dielectric, converting the remainder of said conductive layer exposed by said first resist pattern to a nonconducting dielectric, removing said first resist pattern, depositing a layer of electrical resistor material on the surface of said nonconducting dielectric, depositing a second conductive layer on said layer of electrical resistor material, applying a second resist pattern defining resistors and conductors to said second conductive layer, removing said layer of electrical resistor material and said second conductive layer where exposed by said second resist pattern, removing said second resist pattern, applying a third resist pattern defining conductors to the remainder of said electrical resistor layer, and removing said conductive layer exposed by said third resist pattern.

2. A method of electrical circuit fabrication which comprises the steps of depositing a first conductive film layer on an insulating substrate, anodizing the surface of said first conductive film layer to a nonconducting oxide dielectric, applying a first resist pattern defining capacitor base electrodes to said non-conducting oxide dielectric, anodizing the remainder of said conductive film layer exposed by said first resist pattern to a non-conducting oxide dielectric, removing said first resist pattern, depositing a film layer of electrical resistor material on the surface of said nonconducting oxide dielectric, depositing a second conductive film layer on said film layer of electrical resistor material, applying a second resist pattern defining resistors and conductors to said second conductive film layer, removing said film layer of electrical resistor material and said second conductive film layer where exposed by said second resist pattern, removing said second resist pattern, applying a third resist pattern defining conductors to the remainder of said electrical resistor film layer, and removing said conductive film layer exposed by said third resist pattern.

3. A method of electrical circuit fabrication which comprises the steps of depositing a first conductive metal film on an insulating substrate, anodizing the surface of said first conductive metal film to a non-conducting oxide dielectric, applying a first resist pattern defining capacitor base electrodes to said nonconducting oxide dielectric, anodizing the remainder of said conductive metal film exposed by said first resist pattern to a nonconducting oxide dielectric, removing said first resist pattern, depositing an electrical resistor metal film on the surface of said nonconducting oxide dielectric, depositing a second conductive metal film on said electrical resistor metal film, applying a second resist pattern defining resistors and conductors to said second conductive metal film, removing said electrical resistor metal film and said second conductive metal film where exposed by said second resist pattern, removing said second resist pattern, applying a third resist pattern defining conductors to the remainder of said electrical resistor metal film, and removing said conductive metal film exposed by said third resist pattern.

4. A method of electrical circuit fabrication which comprises the steps of depositing a first conductive metal film on an insulating substrate, anodizing the surface of said first conductive metal film to a nonconducting oxide dielectric, applying a first resist pattern defining capacitor base electrodes to said nonconducting oxide dielectric, anodizing the remainder of said conductive metal film exposed by said first resist pattern to a non-conducting oxide dielectric, removing said first resist pattern, depositing an electrical resistor metal film on the surface of said nonconducting oxide dielectric, depositing a second conductive metal film on said electrical resistor metal film, applying a second resist pattern defining resistors and conductors to said second conductive metal film, removing said electrical resistor metal film and said second conductive metal film where exposed by said second resist pattern, removing said second resist pattern, applying a third resist pattern defining conductors to the remainder of said electrical resistor metal film, and selectively removing said conductive metal film exposed by said third resist pattern.

5. A method of electrical circuit fabrication which comprises the steps of depositing an aluminum conductive film on an insulating substrate, anodizing the surface of said aluminum film to an aluminum oxide dielectric, applying a first resist pattern defining capacitor base electrodes to said aluminum oxide dielectric, anodizing the remainder of said aluminum film exposed by said first resist pattern to an aluminum oxide dielectric, removing said first resist pattern, depositing an electrical resistor metal film on the surface of said aluminum oxide dielectric, depositing a second conductive metal film on said electrical resistor metal film, applying a second resist pattern defining resistors and conductors to said second conductive metal etching film, removing said electrical resistor metal film and said second conductive metal film where exposed by said second resist pattern, removing said second resist pattern, applying a third resist pattern defining conductors to the remainder of said electrical resistor metal film, and selectively etching said conductive metal film exposed by said third resist pattern.

6. A method of electrical circuit fabrication which comprises the steps of depositing an aluminum conductive film on an insulating substrate, anodizing the surface of said aluminum film to an aluminum oxide dielectric, applying a first resist pattern defining capacitor base electrodes to said aluminum oxide dielectric, anodizing the remainder of said aluminum film exposed by said first resist pattern to an aluminum oxide dielectric, removing said first resist pattern, depositing an electrical resistor metal film on the surface of said aluminum oxide dielectric, depositing a second conductive metal film on said electrical resistor metal film, applying a second resist pattern defining resistors and conductors to said second conductive metal film, etching said electrical resistor metal film and said second conductive metal film where exposed by said second resist pattern, removing said second resist pattern, applying a third resist pattern defining conductors to the remainder of said electrical resistor metal film, selectively etching said conductive metal film exposed by said third resist pattern, and removing said third resist pattern.

7. A method of electrical circuit fabrication which comprises the steps of vacuum depositing an aluminum conductive film on an insulating substrate, anodizing the surface of said aluminum film to an aluminum oxide dielectric, applying a first resist pattern defining capacitor base electrodes to said aluminum oxide dielectric, anodizing the remainder of said aluminum film exposed by said first resist pattern to an aluminum oxide dielectric, removing said first resist pattern, vacuum depositing an electrical resistor metal film on the surface of said aluminum oxide dielectric, vacuum depositing a second conductive metal film on said electrical resistor metal film, applying a second resist pattern defining resistors and conductors to said second conductive metal film, etching said electrical resistor metal film and said second conductive metal film where exposed by said second resist pattern, removing said second resist pattern, applying a third resist pattern defining conductors to the remainder of said electrical resistor metal film, selectively etching said conductive metal film exposed by said third resist pattern, and removing said third resist pattern.

8. A method of electrical circuit fabrication which comprises the steps of vacuum depositing an aluminum film on an insulating substrate, anodizing the surface of said aluminum film to an aluminum oxide dielectric, applying a first resist pattern defining capacitor base electrodes to said aluminum oxide dielectric, anodizing the remainder of said aluminum film exposed by said first resist pattern to an aluminum oxide dielectric, removing said first resist pattern, vacuum depositing a nickel-chromium electrical resistor alloy film on the surface of said aluminum oxide dielectric, vacuum depositing a nickel film on said nickel-chromium electrical resistor alloy film, applying a second resist pattern defining resistors and conductors to said nickel film, etching said nickel-chromium electrical resistor alloy film and said nickel film where exposed by said second resist pattern, removing said second resist pattern, applying a third resist pattern defining conductors to the remainder of said nickel-chromium electrical resistor alloy film, selectively etching said nickel film exposed by said third resist pattern, and removing said third resist pattern.

References Cited

UNITED STATES PATENTS

| | | | |
|---|---|---|---|
| 3,169,892 | 2/1965 | Lemelson | 174—68.5 |
| 3,217,209 | 11/1965 | Kinsella et al. | 317—256 |
| 3,220,938 | 11/1965 | McLean et al. | 204—15 |
| 3,240,602 | 3/1966 | Johnston | 204—15 |
| 3,240,685 | 3/1966 | Miassel | 204—15 |

JOHN H. MACK, *Primary Examiner.*

T. TUFARIELLO, *Assistant Examiner.*